United States Patent
Chen et al.

(10) Patent No.: US 9,237,808 B2
(45) Date of Patent: Jan. 19, 2016

(54) BRACKET ASSEMBLY FOR SLIDE

(71) Applicant: KING SLIDE WORKS CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 25 days.

(21) Appl. No.: 14/285,876

(22) Filed: May 23, 2014

(65) Prior Publication Data

US 2015/0335156 A1    Nov. 26, 2015

(51) Int. Cl.
 *A47B 96/06* (2006.01)
 *A47B 96/07* (2006.01)
 *A47B 57/00* (2006.01)
 *A47B 88/10* (2006.01)
 *A47B 88/14* (2006.01)
 *A47B 88/04* (2006.01)

(52) U.S. Cl.
 CPC ............... *A47B 96/07* (2013.01); *A47B 57/00* (2013.01); *A47B 88/044* (2013.01); *A47B 88/10* (2013.01); *A47B 88/14* (2013.01)

(58) Field of Classification Search
 CPC ........ A47B 88/10; A47B 88/14; A47B 88/16; A47B 88/044
 USPC ............... 248/219.1, 221.11, 244, 225.21; 312/333, 334.46, 334.44, 334.47
 See application file for complete search history.

(56) References Cited

U.S. PATENT DOCUMENTS

| | | | |
|---|---|---|---|
| 6,773,080 B2 * | 8/2004 | Chen | A47B 57/40 211/26 |
| 7,357,362 B2 * | 4/2008 | Yang | A47B 88/044 248/220.22 |
| 7,930,812 B2 | 4/2011 | Curnalia et al. | |
| 8,353,494 B2 | 1/2013 | Peng et al. | |

* cited by examiner

*Primary Examiner* — Todd M Epps
(74) *Attorney, Agent, or Firm* — Rosenberg, Klein & Lee

(57) ABSTRACT

A bracket assembly includes a bracket, an inserting member, an elastic member disposed on the bracket, first and second arms oppositely and pivotally connected to the bracket, and an operation member. The elastic member includes first and second elastic portions correspondingly disposed. The first and second arms each include a first portion having a contact portion abutting against the respective first or second elastic portion and a second portion having a hook portion and a connecting portion oppositely disposed. The operation member is connected between the connecting portions of the first and second arms.

8 Claims, 9 Drawing Sheets

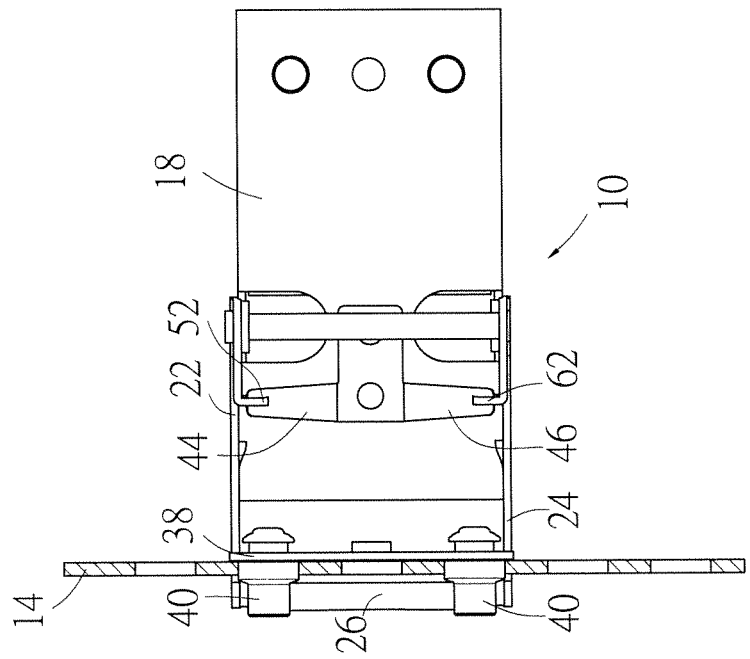
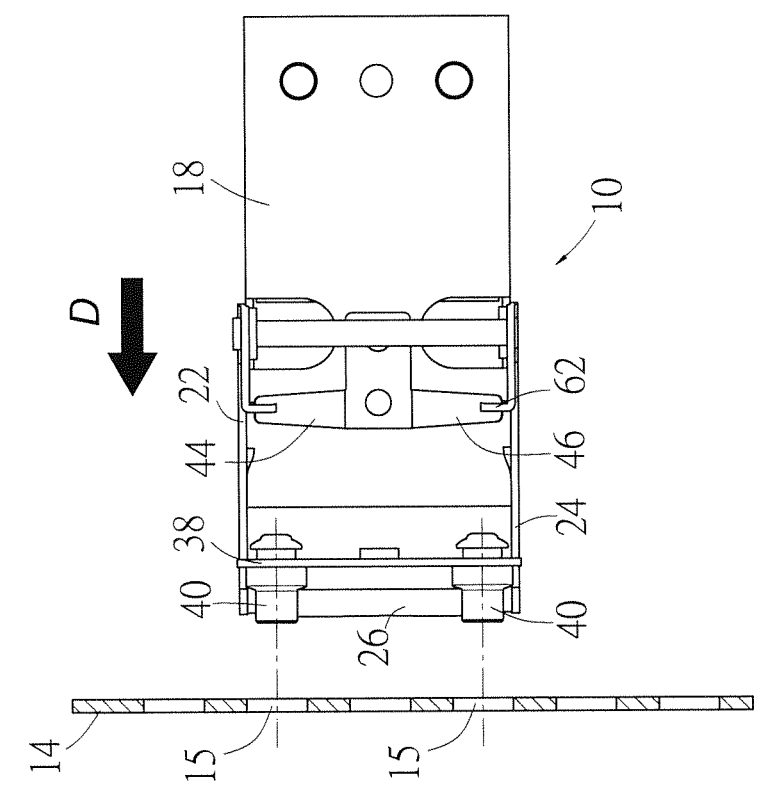

BRACKET ASSEMBLY FOR SLIDE

BACKGROUND OF THE INVENTION

1. Field of the Invention

The present invention relates to a bracket, particularly to a bracket assembly for a slide which can be manually operated.

2. Description of the Related Art

In general, a rack device is assembled on a rack by means of a pair of slide assemblies. That is to say, the rack usually comprises a first pair of supports and a second pair of supports. Wherein, the first pair of supports corresponds in position to the second pair of supports. One side of the rack device is assembled on the first pair of supports by a slide assembly; the other side of the rack device is assembled on the second pair of supports by another slide assembly. Moreover, the supports of the rack each generally include at least one mounting hole; two opposite ends of each slide assembly respectively include a bracket. The bracket has an inserting member which can be inserted into the mounting holes of the supports, whereby the two opposite ends of each slide assembly can be respectively assembled on the supports of the rack for positioning the slide assembly on the rack.

U.S. Pat. No. 7,357,362 discloses a bracket positioning structure for a slide, in which, as shown in FIGS. 2, 3, and 5, the bracket positioning structure for a slide is assembled on holes 71 of a support 7 via a pair of studs 2 formed on an endplate 11. Wherein, as shown in FIG. 3, the studs 2 on the end plate 11 of the bracket 1 are respectively inserted into the holes 71 of the support 7 while the bracket positioning structure is assembled on the support 7. Moreover, a tooth 43 of an arm 42 of the bracket 1 is allowed to slide along an edge of the support 7 by means of a bevel edge 431 for shifting the arm 42. While the bracket 1 is moved to a position, as shown in FIG. 5, the tooth 43 of the arm 42 of the bracket 1 will hooks the support 7 and is secured thereat, whereby the bracket 1 can be firmly positioned on the support 7. However, the bracket positioning structure does not have an operation member by which a user can control the movements of the arm 42 of the bracket 1. As a consequence, the convenience in assembling the bracket 1 on the support 7 and disassembling the bracket 1 from the support 7 is still wanted.

SUMMARY OF THE INVENTION

The present invention relates to a manually-operable bracket assembly for a slide.

In one aspect of the present invention, a bracket assembly comprises a bracket, at least one inserting member, a first arm, and an elastic member. The bracket includes a longitudinal body and an end plate disposed on the longitudinal body. The inserting member is disposed on the end plate of the bracket. The first arm is movably connected to the bracket and has a first hook portion at one end thereof corresponding in position to the end plate of the bracket. The elastic member is configured to urge the first hook portion of the first arm towards the bracket.

Preferably, the bracket further includes a first connecting base and a second connecting base which are disposed on the longitudinal body of the bracket; the first arm is pivotally connected to the first connecting base; the bracket assembly further comprises a second arm pivotally connected to the second connecting base.

Preferably, the elastic member is disposed on the bracket and located between the first connecting base and the second connecting base; the second arm has a second hook portion at one end thereof corresponding in position to the endplate of the bracket; the elastic member is also configured to urge the second hook portion of the second arm towards the bracket.

Preferably, the elastic member further includes a base plate, a first elastic portion, and a second elastic portion, wherein at least one of the first elastic portion and the second elastic portion is uplifted from one end of the base plate.

Preferably, the bracket assembly further comprises an operation member connected between the first arm and the second arm.

In another aspect of the present invention, a bracket assembly is adapted to a rack, which includes at least one hole, and comprises a bracket, at least one inserting member, an elastic member, a first arm, a second arm, and an operation member. The bracket includes a longitudinal body and an endplate disposed on the longitudinal body. The inserting member is disposed on the end plate of the bracket. The elastic member is disposed on the bracket and includes a first elastic portion and a second elastic portion. The first arm is movably connected to the bracket and includes a first portion and a second portion opposite to the first portion, wherein the first portion of the first arm includes a first contact portion abutting against the first elastic portion of the elastic member, and the second portion of the first arm corresponds in position to the endplate of the bracket and includes a first hook portion. The second arm is movably connected to the bracket and includes a first portion and a second portion opposite to the first portion, wherein the first portion of the second arm includes a second contact portion abutting against the second elastic portion of the elastic member, and the second portion of the second arm corresponds in position to the end plate of the bracket and includes a second hook portion. The operation member is connected between the first arm and the second arm. When the bracket assembly is mounted on the rack, the at least one inserting member is inserted into the at least one hole of the rack, and meanwhile, the first hook portion of the second portion of the first arm and the second hook portion of the second portion of the second arm clasp the rack due to elastic force against the first contact portion and the second contact portion provided by the first elastic portion and the second elastic portion.

Preferably, the elastic member further includes a base plate, wherein the first elastic portion and the second elastic portion are uplifted from two opposite ends of the base plate, respectively.

In yet another aspect of the present invention, a bracket assembly comprises a bracket, at least one inserting member, an elastic member, a first arm, a second arm, and an operation member. The bracket includes a longitudinal body, a first connecting base, a second connecting base corresponding in position to the first connecting base, and an end plate disposed on the longitudinal body, wherein the first connecting base and the second connecting base are disposed on the longitudinal body. The inserting member is disposed on the end plate of the bracket. The elastic member is disposed on the bracket and located between the first connecting base and the second connecting base and includes a first elastic portion and a second elastic portion. The first arm is pivotally connected to the first connecting base of the bracket and includes a first portion and a second portion opposite to the first portion, wherein the first portion of the first arm includes a first contact portion abutting against the first elastic portion of the elastic member, and the second portion of the first arm corresponds in position to the end plate of the bracket and includes a first hook portion and a first connecting portion disposed close to the first hook portion. The second arm is pivotally connected to the second connecting base of the bracket and includes a first portion and a second portion opposite to the first portion, wherein the first portion of the second arm includes a second contact portion abutting against the second elastic portion of the elastic member, and the second portion of the second arm corresponds in position to the end plate of the bracket and includes a second hook portion and a second connecting portion disposed close to the second hook portion. The operation member is connected between the first connecting portion of the first arm and the second connecting portion of the second arm.

Preferably, the elastic member further includes a base plate, wherein the first elastic portion and the second elastic portion are uplifted from two opposite ends of the base plate, respectively.

One characteristic of the embodiment of the present invention is that the bracket assembly is adapted to a slide assembly and can be assembled on a rack; moreover, when a user operates the operation member and does not release it until an inserting member of the bracket assembly is inserted into a hole of the rack, a hook portion of a arm can be driven to clasp the rack due to the elastic force provided by an elastic member, thus assembling the bracket assembly on the rack.

BRIEF DESCRIPTION OF THE DRAWINGS

FIG. 8 is a schematic view showing operations of assembling the bracket assembly on the rack;

FIG. 9 is another schematic view showing operations of assembling the bracket assembly on the rack.

DETAILED DESCRIPTION OF THE PREFERRED EMBODIMENTS

Figure 1:
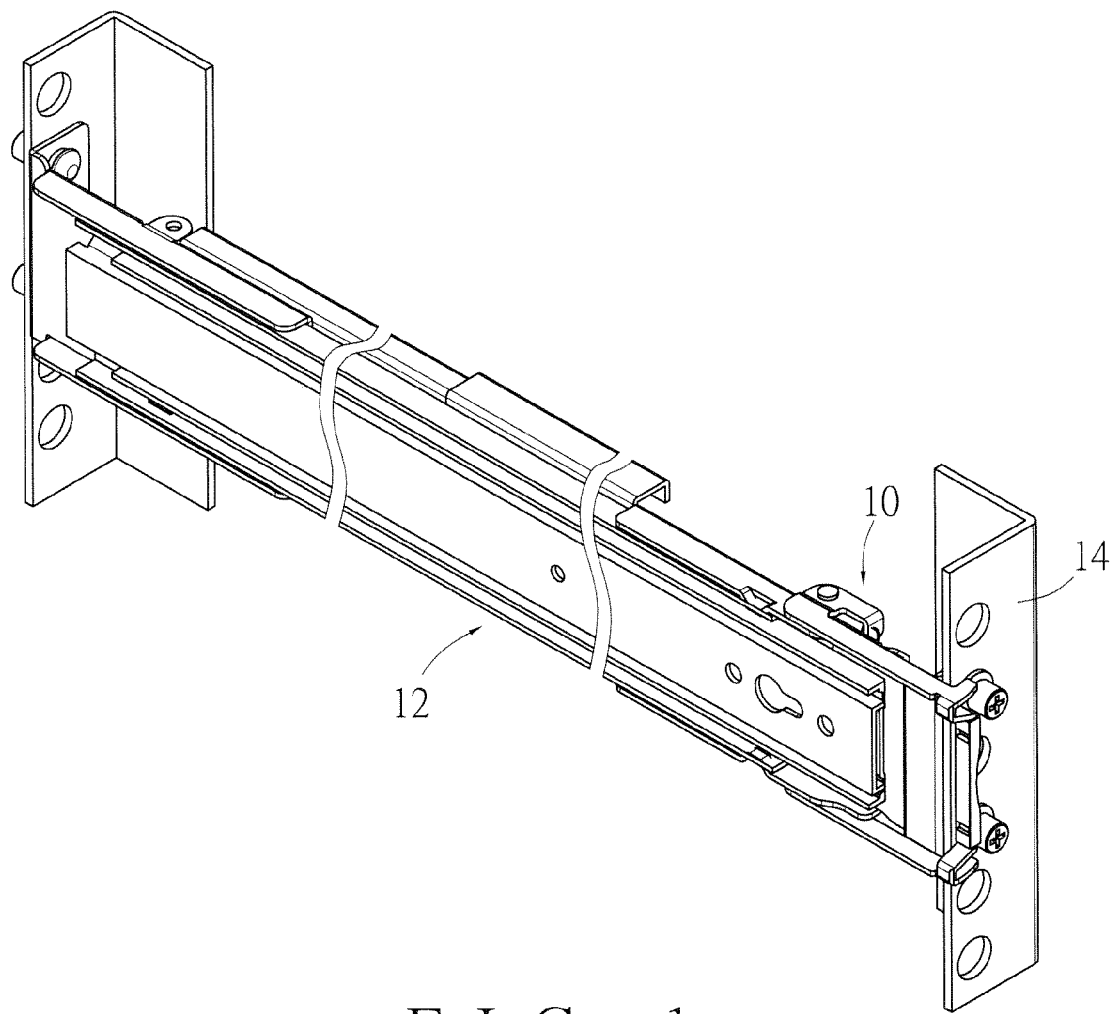
FIG. 1 is a perspective view showing a bracket assembly which is disposed on a slide assembly and assembled on a rack.
Figure 2:
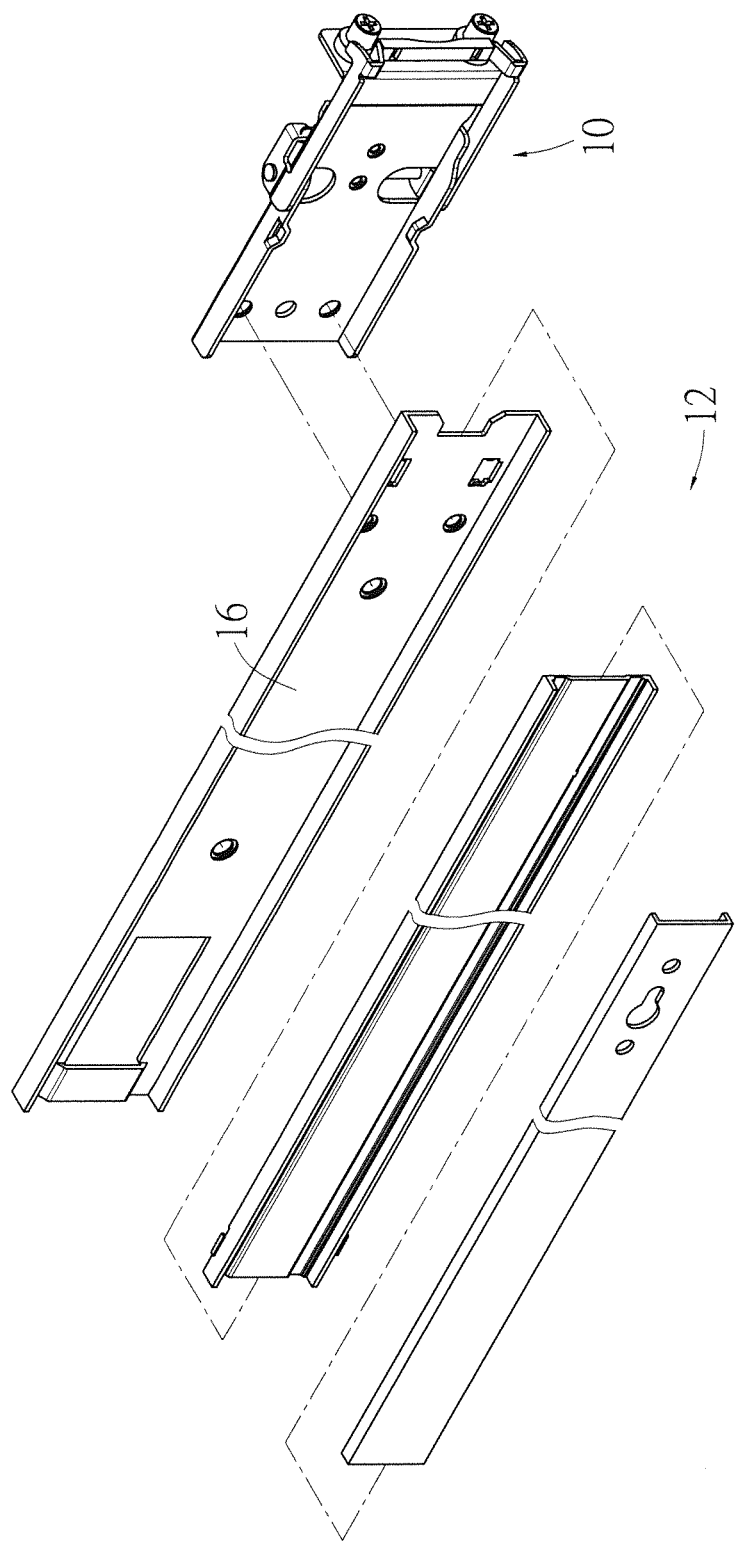
FIG. 2 is an exploded view of FIG. 1 showing the bracket assembly which is disposed adjacent to one end of the slide assembly.

FIG. 1 shows an embodiment of a bracket assembly 10 adapted to a slide assembly 12 and a rack 14, wherein the slide assembly 12 can be mounted to the rack 14 by means of the bracket assembly 10. As shown in FIG. 2, the bracket assembly 10 can be disposed adjacent to an end of a first rail 16 (e.g., the outer rail) of the slide assembly 12.

Figure 3:
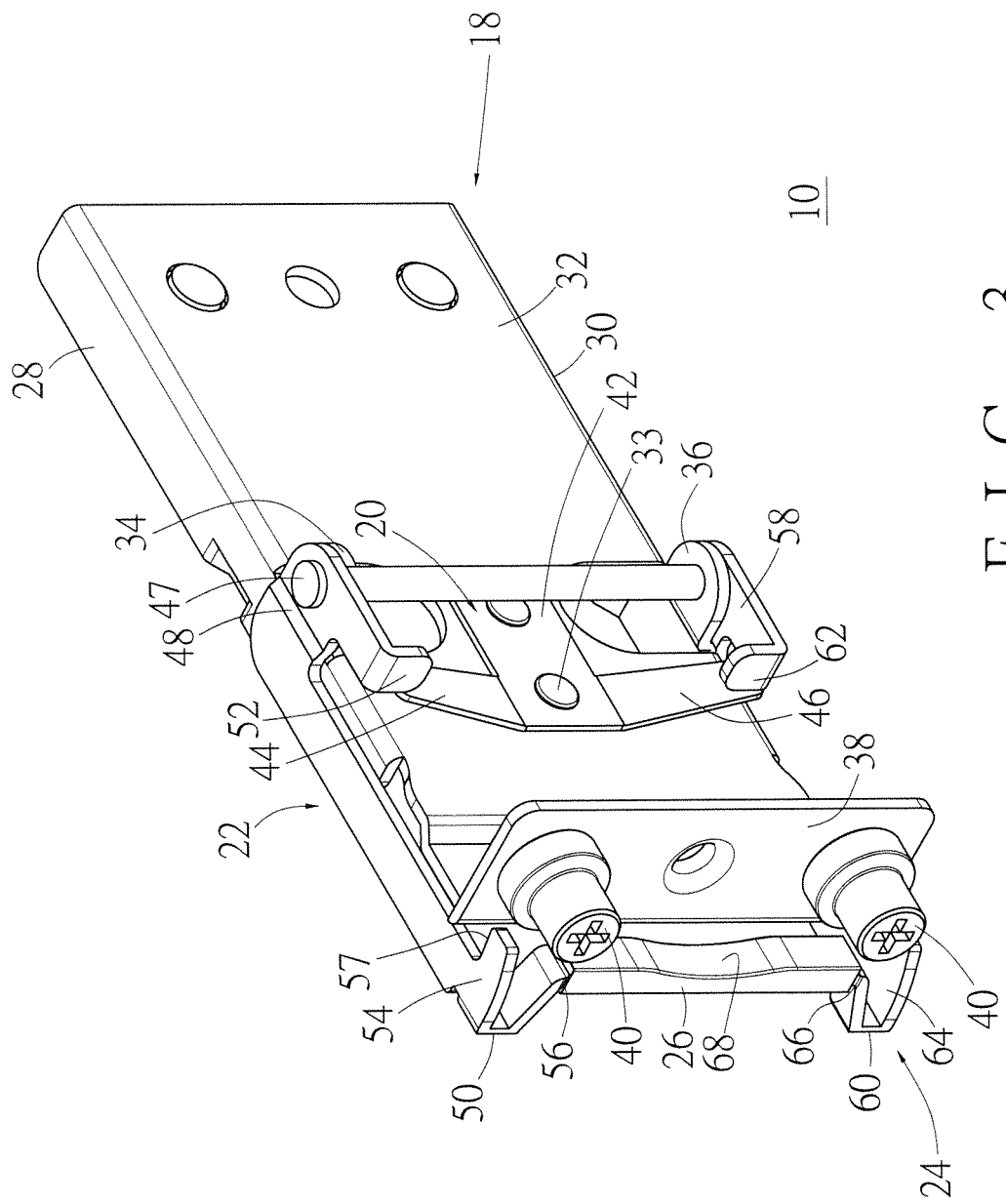
FIG. 3 is a perspective view showing a bracket assembly in accordance with an embodiment of the present invention.
Figure 4:
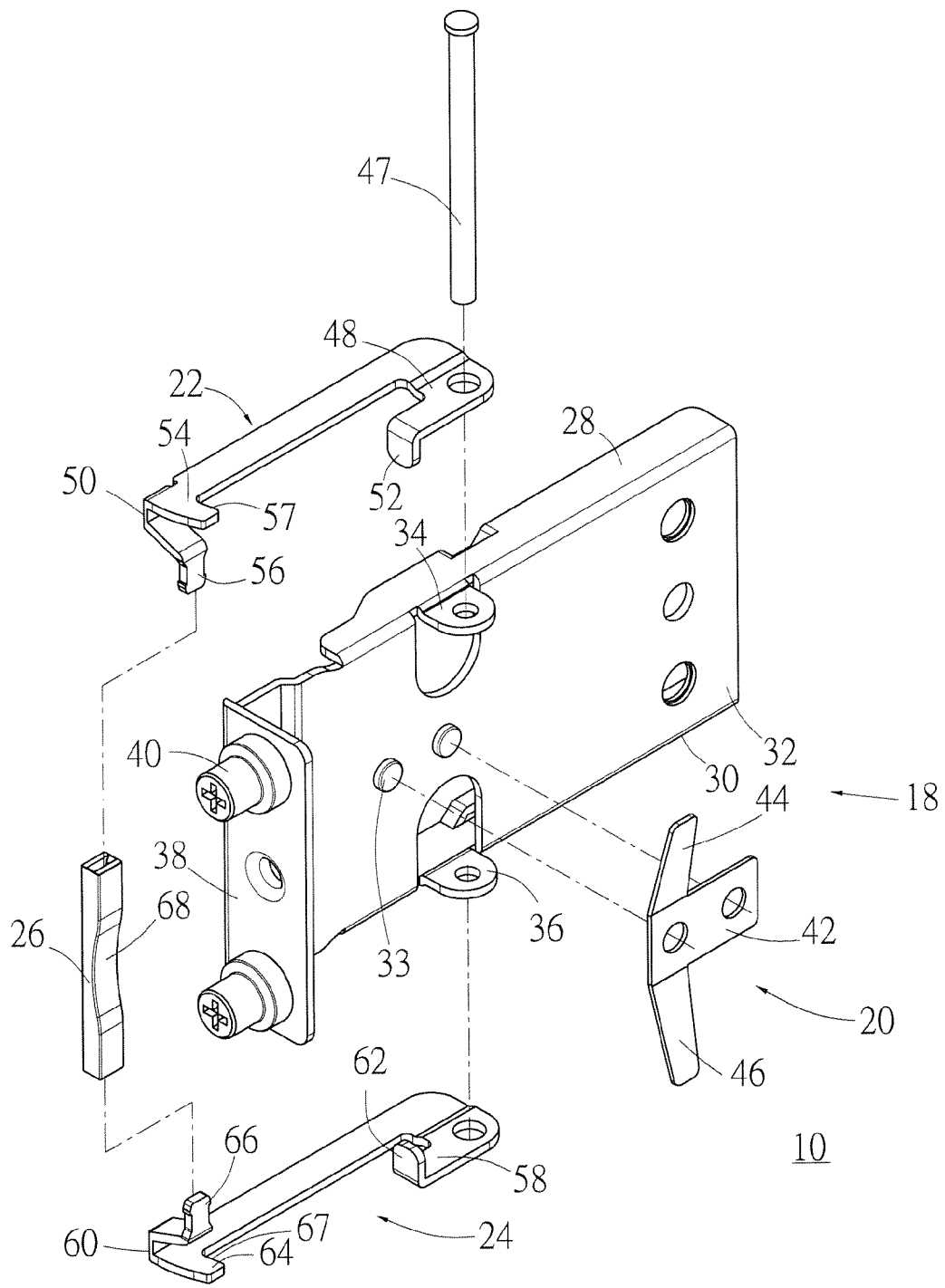
FIG. 4 is an exploded view showing a bracket assembly in accordance with the embodiment of the present invention.
Figure 5:
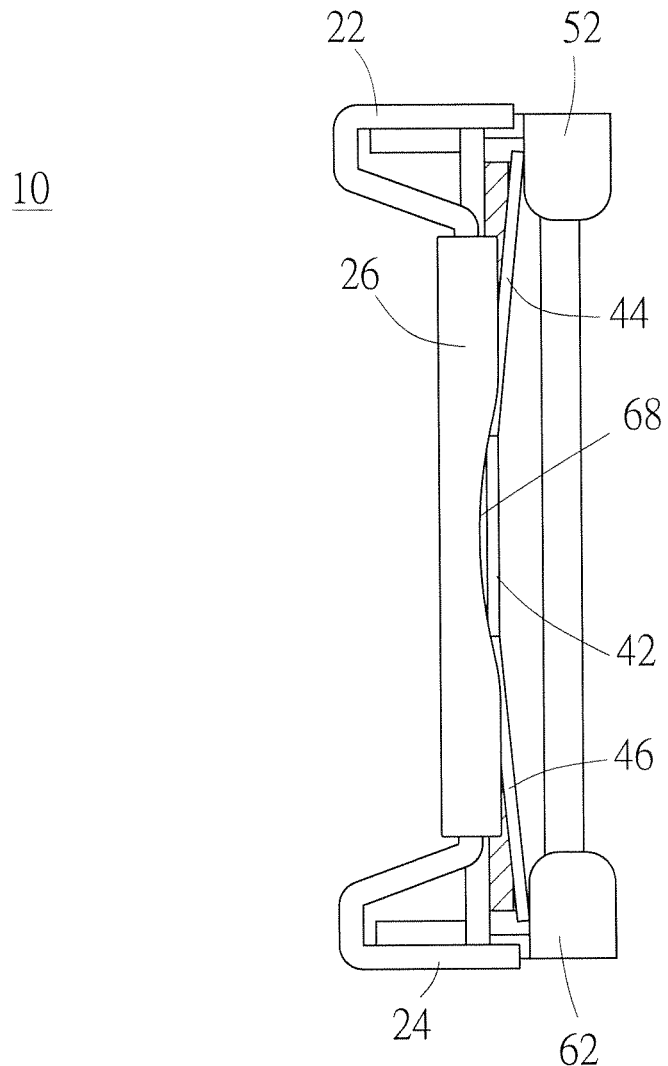
FIG. 5 is schematic view showing a first contact portion and a second contact portion abut against a first elastic portion and a second elastic portion, respectively, while an operation member has not yet been operated.

Referring to FIGS. 3 to 5, the bracket assembly 10 comprises a bracket 18, an elastic member 20, a first arm 22, a second arm 24, and at least one inserting member 40. The first arm 22 is provided with a first hook portion 54, and the second arm 24 is provided with a second hook portion 64.

The bracket 18 includes a first wall 28, a second wall 30 disposed opposite to the first wall 28, and a longitudinal body 32 connected between the first wall 28 and the second wall 30, wherein the longitudinal body 32 includes at least one assembling portion 33.

In more detail, the bracket 18 includes a first connecting base 34, a second connecting base 36 corresponding in position to the first connecting base 34, and an end plate 38 disposed on the longitudinal body 32. Preferably, the end plate 38 is perpendicularly disposed adjacent to an end portion of the longitudinal body 32 of the bracket 18. The first connecting base 34 and the second connecting base 36 are disposed on the longitudinal body 32 of the bracket 18, wherein the first connecting base 34 is disposed adjacent to the first wall 28, and the second connecting base 36 is disposed adjacent to the second wall 30. The assembling portion 33 is preferably located between the first connecting base 34 and the second connecting base 36.

The elastic member 20 is configured to urge at least one of the first hook portion 54 of the first arm 22 and the second hook portion 64 of the second arm 24 towards the bracket 18. In one preferred embodiment, the elastic member 20 includes a base plate 42, a first elastic portion 44, and a second elastic portion 46. The base plate 42 is correspondingly fit with the assembling portion 33 of the longitudinal body 32 of the bracket 18 so that the elastic member 20 can be disposed on the longitudinal body 32 of the bracket 18 and located between the first connecting base 34 and the second connecting base 36. The first elastic portion 44 and the second elastic portion 46 are uplifted from two opposite ends of the base plate 42, respectively. Accordingly, a predetermined included angle is formed between the first elastic portion 44 and the longitudinal body 32 of the bracket 18 for allowing the first elastic portion 44 to be pressed down elastically and thereby generate a first elastic force; also, a predetermined included angle is formed between the second elastic portion 46 and the longitudinal body 32 of the bracket 18 for allowing the second elastic portion 46 to be pressed down elastically and thereby generate a second elastic force.

The first arm 22 is movably connected to the bracket 18. Preferably, the first arm 22 is pivotally connected to the first connecting base 34 of the bracket 18 via a connecting element 47 and is rotatable in response to the first elastic force of the first elastic portion 44 of the elastic member 20. Further, the first arm 22 includes a first portion 48 and a second portion 50 opposite to the first portion 48. The first portion 48 of the first arm 22 includes a first contact portion 52 correspondingly abutting against the first elastic portion 44 of the elastic member 20, wherein the first contact portion 52 can be bent to form an L-shape, but is not limited thereto. The second portion 50 of the first arm 22 corresponds in position to the end plate 38 of the bracket 18 and includes a first connecting portion 56, wherein the first hook portion 54 is also disposed on the second portion 50 of the first arm 22 and located close to the first connecting portion 56. The first hook portion 54 of the first arm 22 includes a hook surface 57 and extends in a horizontal direction, while the first connecting portion 56 extends in a vertical direction. It is noted that the second portion 50 of the first arm 22 can be moved toward and away from the endplate 38 of the bracket 18 in response to rotation of the first arm 22.

The second arm 24 is movably connected to the bracket 18. Preferably, the second arm 24 is pivotally connected to the second connecting base 36 of the bracket 18 via the connecting element 47 and is rotatable in response to the second elastic force of the second elastic portion 46 of the elastic member 20. The second arm 24 includes a first portion 58 and a second portion 60 opposite to the first portion 58. The first portion 58 of the second arm 24 includes a second contact portion 62 correspondingly abutting against the second elastic portion 46 of the elastic member 20, wherein the second contact portion 62 is bent to form an L-shape, but is not limited thereto. The second portion 60 of the second arm 24 corresponds in position to the end plate 38 of the bracket 18 and includes a second connecting portion 66, wherein the second hook portion 64 is also disposed on the second portion 60 of the second arm 24 and located close to the second connecting portion 66. The second hook portion 64 of the second arm 24 includes a hook surface 67 and extends in a horizontal direction, while the second connecting portion 66 extends in a vertical direction. It is noted that the second portion 60 of the second arm 24 can be moved toward and away from the end plate 38 of the bracket 18 in response to rotation of the second arm 24.

The inserting member 40 is disposed on the end plate 38 of the bracket 18, wherein the inserting member 40 can be a circular stud, a square stud, or stud formed in other shapes. In other words, the inserting member 40 is not restricted to be formed as the circular stud illustrated in this embodiment.

Preferably, the bracket assembly 10 further comprises an operation member 26. The operation member 26 is assembled to or integrally formed with the first connecting portion 56 of the first arm 22 and the second connecting portion 66 of the second arm 24 and thus extends between the first connecting portion 56 of the first arm 22 and the second connecting portion 66 of the second arm 24. The operation member 26 can be formed into a rod-like shank with a slightly curved operating surface 68, whereby user can simply operate the operation member 26 by fingers to rotate the first arm 22 and the second arm 24, for example, from a first position (as shown in FIG. 3) to a second position (as shown in FIG. 6).

Figure 6:
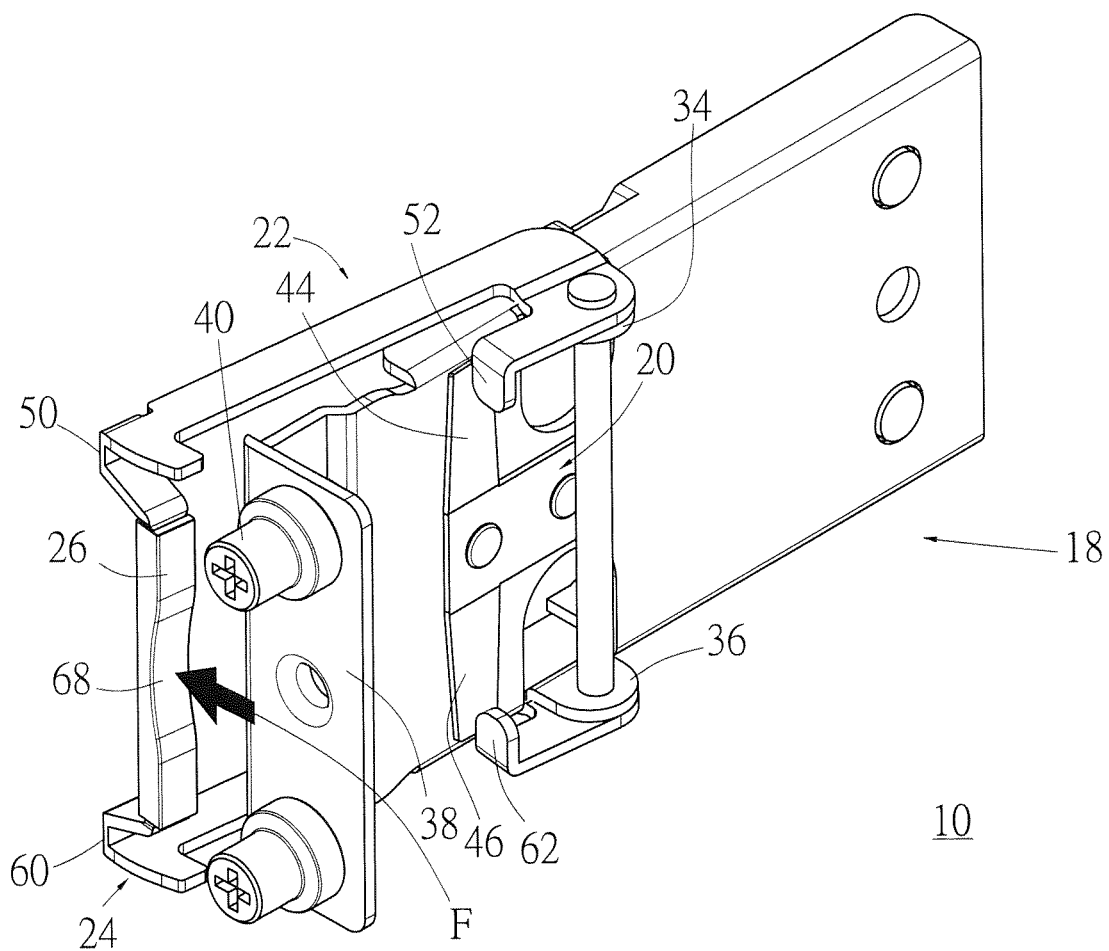
FIG. 6 is a schematic view showing a second portion of a first arm and a second portion of a second arm are moved away from an end plate of the bracket while the operation member is operated.
Figure 7:
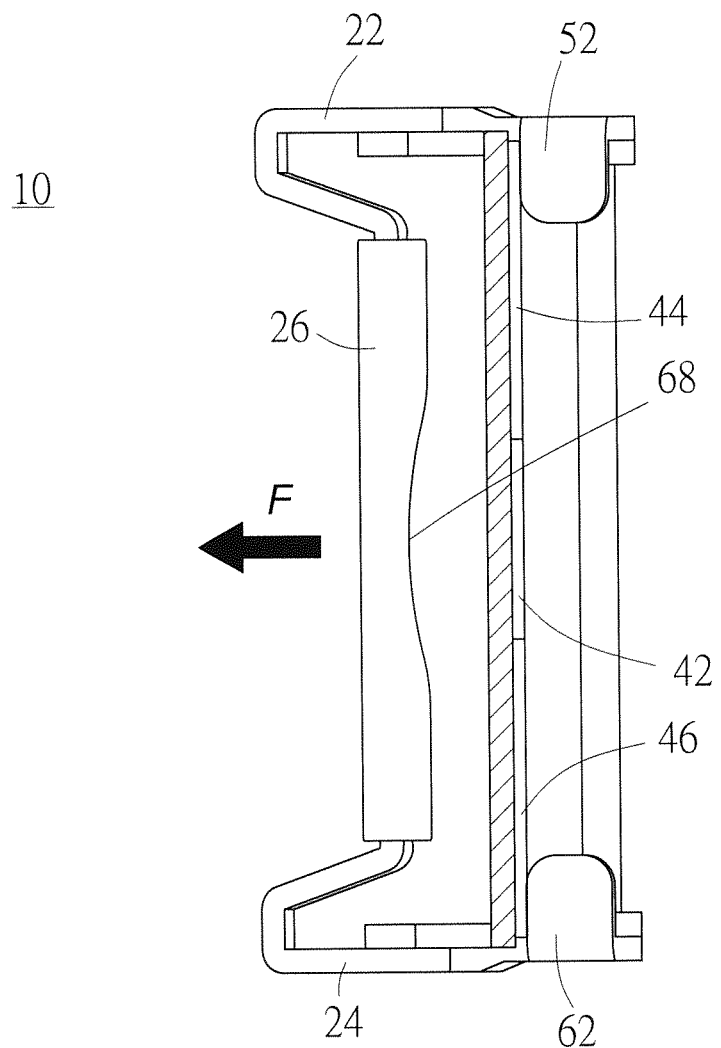
FIG. 7 is a schematic view showing the first contact portion and the second contact portion press against the first elastic portion and the second elastic portion, respectively, while the operation member is operated.

Referring to FIGS. 6 and 7, when a user exerts a force F on the operating surface 68 of the operation member 26, the first arm 22 and the second arm 24 are driven to rotate from the first position (as shown in FIGS. 3 and 5) to the second position (as shown in FIGS. 6 and 7) and make the second portion 50 of the first arm 22 and the second portion 60 of the second arm 24 be moved away from the end plate 38 of the bracket 18 due to the fact that the first arm 22 and the second arm 24 are pivotally connected to the first connecting base 34 and the second connecting base 36, respectively; meanwhile, the first elastic portion 44 is pressed against by the first contact portion 52 of the first arm 22 to accumulate the first elastic force, and the second elastic portion 46 of the elastic member 20 is pressed against by the second contact portion 62 of the second arm 24 to accumulate the second elastic force.

Further, when the operation member 26 is not operated any more (i.e., when the force F is removed from the operating surface 68 of the operation member 26), the accumulated first elastic force and second elastic force are released to allow the first elastic portion 44 and the second elastic portion 46 to push against the first contact portion 52 of the first arm 22 and the second contact portion 62 of the second arm 24, respectively. Therefore, the first arm 22 and the second arm 24 are rotated back and drive the second portion 50 of the first arm 22 and the second portion 60 of the second arm 24 to move toward the end plate 38 of the bracket 18. Namely, the first arm 22 and the second arm 24 are rotated back from the second position (as shown in FIGS. 6 and 7) to the first position (as shown in FIGS. 3 and 5). Simultaneously, the first elastic portion 44 and the second elastic portion 46 of the elastic member 20 return to their respect original states, i.e., uplifted from two opposite ends of the base plate 42 respectively.

FIGS. 8 and 9 are schematic views showing how the bracket assembly 10 is assembled on the rack 14.

Specifically, the bracket assembly 10 is adapted to the rack 14 which includes at least one hole 15, wherein the hole 15 can be formed in a circle, square, or other shapes. That is to say that the hole 15 is not restricted to be formed in a circle as shown in this embodiment.

To assemble the bracket 18 on the rack 14, the user initially operates the operation member 26 (as shown in FIG. 6) to move the second portion 50 of the first arm 22 and the second portion 60 of the second arm 24 away from the endplate 38 of the bracket 18, and simultaneously, the user moves the bracket assembly 10 toward the rack 14 in a direction D for allowing the inserting member 40 to be aligned with and received in the hole 15 of the rack 14. Consequently, the second portion 50 of the first arm 22 and the second portion 60 of the second arm 24 are spaced apart from the rack 14 by a distance during the insertion of the inserting member 40 into the hole 15 of the rack 14.

Figure 10:
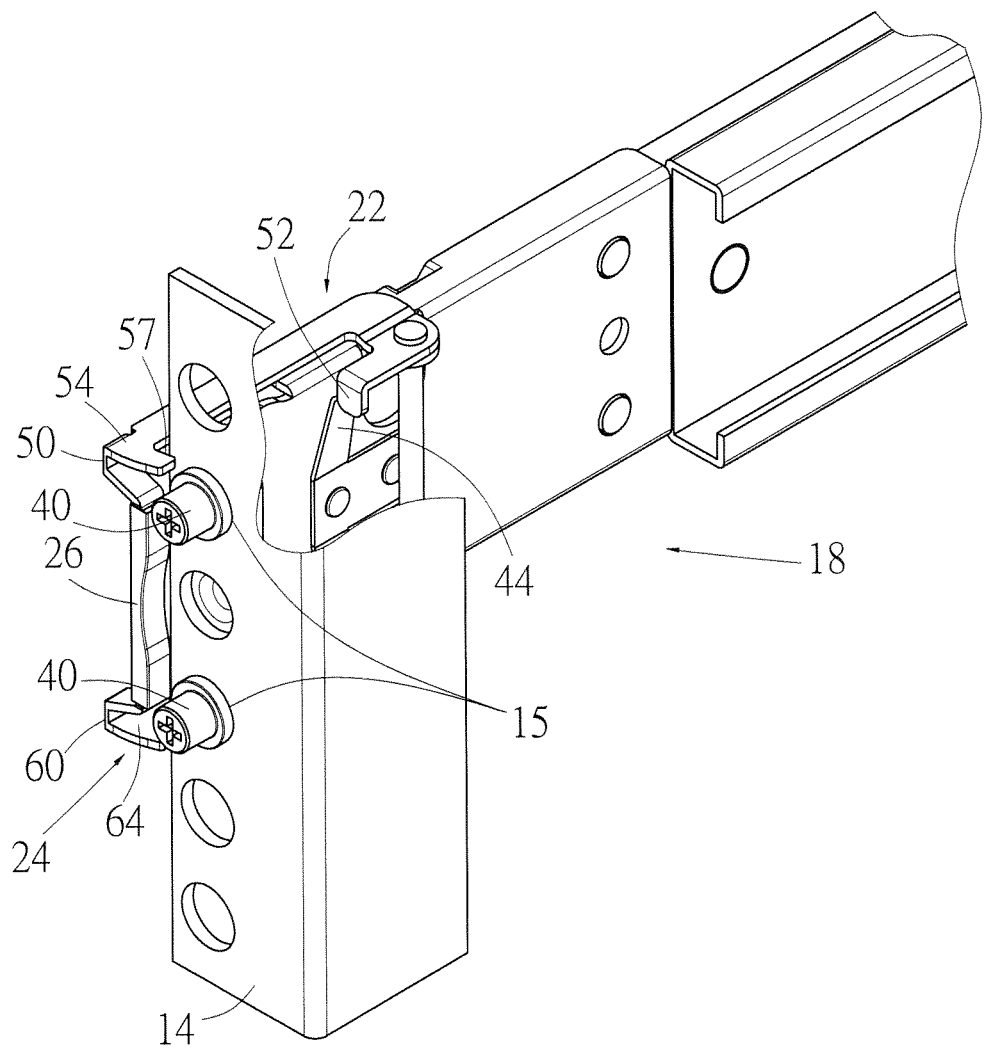
FIG. 10 is a perspective showing the bracket assembly positioned on the rack, wherein the first hook portion of the first arm and the second hook portion of the second arm clasp the rack.

Subsequently, referring to FIG. 10, the user stops operating the operation member 26 (i.e., releases the operation member 26) after the inserting member 40 is inserted into the hole 15 of the rack 14. As a result, the first elastic portion 44 and the second elastic portion 46 return to their respect original states (as shown in FIG. 3) due to their elasticity, and thus the first contact portion 52 and the second contact portion 62 are pushed against by the first elastic portion 44 and the second elastic portion 46, respectively, and thereby drive the first hook portion 54 of the second portion 50 of the first arm 22 and the second hook portion 64 of the second portion 60 of the second arm 24 to clasp the rack 14 by means of the hook surface 57 of the first hook portion 54 and the hook surface 67 of the second hook portion 64. Therefore, the bracket 18 is firmly assembled on the rack 14.

While we have shown and described the embodiment in accordance with the present invention, it should be clear to those skilled in the art that further embodiments may be made without departing from the scope of the present invention.

What is claimed is:

1. A bracket assembly, comprising:
    a bracket including a longitudinal body and an end plate disposed on the longitudinal body;
    at least one inserting member disposed on the end plate of the bracket;
    a first arm movably connected to the bracket, the first arm having a first hook portion at one end thereof corresponding in position to the end plate of the bracket; and
    an elastic member configured to urge the first hook portion of the first arm towards the bracket;
    wherein the bracket further includes a first connecting base and a second connecting base which are disposed on the longitudinal body of the bracket, the first arm is pivotally connected to the first connecting base, and wherein the bracket assembly further comprises a second arm pivotally connected to the second connecting base.

2. The bracket assembly as claimed in claim 1, wherein the elastic member is disposed on the bracket and located between the first connecting base and the second connecting base, the second arm has a second hook portion at one end thereof corresponding in position to the end plate of the bracket, and wherein the elastic member is also configured to urge the second hook portion of the second arm towards the bracket.

3. The bracket assembly as claimed in claim 2, wherein the elastic member further includes a base plate, a first elastic portion, and a second elastic portion, and wherein at least one of the first elastic portion and the second elastic portion is uplifted from one end of the base plate.

4. The bracket assembly as claimed in claim 1, further comprising an operation member connected between the first arm and the second arm.

5. A bracket assembly for slide, the bracket assembly adapted to a rack, the rack including at least one hole, the bracket assembly comprising:
   a bracket including a longitudinal body and an end plate disposed on the longitudinal body;
   at least one inserting member disposed on the end plate of the bracket;
   an elastic member disposed on the bracket, the elastic member including a first elastic portion and a second elastic portion;
   a first arm movably connected to the bracket, the first arm including a first portion and a second portion opposite to the first portion of the first arm, wherein the first portion of the first arm includes a first contact portion abutting against the first elastic portion of the elastic member, and the second portion of the first arm corresponds in position to the end plate of the bracket and includes a first hook portion;
   a second arm movably connected to the bracket, the second arm including a first portion and a second portion opposite to the first portion of the second arm, wherein the first portion of the second arm includes a second contact portion abutting against the second elastic portion of the elastic member, and the second portion of the second arm corresponds in position to the end plate of the bracket and includes a second hook portion; and
   an operation member connected between the first arm and the second arm;
   wherein, when the bracket assembly is mounted on the rack, the at least one inserting member is inserted into the at least one hole of the rack, and meanwhile, the first hook portion of the second portion of the first arm and the second hook portion of the second portion of the second arm clasp the rack due to elastic force against the first contact portion and the second contact portion provided by the first elastic portion and the second elastic portion.

6. The bracket assembly as claimed in claim 5, wherein the elastic member further includes a base plate, and the first elastic portion and the second elastic portion are uplifted from two opposite ends of the base plate, respectively.

7. A bracket assembly, comprising:
   a bracket including a longitudinal body, a first connecting base, a second connecting base corresponding in position to the first connecting base, and an end plate disposed on the longitudinal body, wherein the first connecting base and the second connecting base are disposed on the longitudinal body;
   at least one inserting member disposed on the end plate of the bracket;
   an elastic member disposed on the bracket and located between the first connecting base and the second connecting base, the elastic member including a first elastic portion and a second elastic portion;
   a first arm pivotally connected to the first connecting base of the bracket, the first arm including a first portion and a second portion opposite to the first portion of the first arm, wherein the first portion of the first arm includes a first contact portion abutting against the first elastic portion of the elastic member, and the second portion of the first arm corresponds in position to the end plate of the bracket and includes a first hook portion and a first connecting portion disposed close to the first hook portion;
   a second arm pivotally connected to the second connecting base of the bracket, the second arm including a first portion and a second portion opposite to the first portion of the second arm, wherein the first portion of the second arm includes a second contact portion abutting against the second elastic portion of the elastic member, and the second portion of the second arm corresponds in position to the end plate of the bracket and includes a second hook portion and a second connecting portion disposed close to the second hook portion; and
   an operation member connected between the first connecting portion of the first arm and the second connecting portion of the second arm.

8. The bracket assembly as claimed in claim 7, wherein the elastic member further includes a base plate, and wherein the first elastic portion and the second elastic portion are uplifted from two opposite ends of the base plate, respectively.

* * * * *